United States Patent [19]

Ono et al.

[11] Patent Number: 5,440,581
[45] Date of Patent: Aug. 8, 1995

[54] SEMICONDUCTOR OPTICAL FILTER AND AN OPTICAL COMMUNICATION SYSTEM USING THE SAME

[75] Inventors: Takeo Ono; Jun Nitta, both of Sagamihara, Japan

[73] Assignee: Canon Kabushiki Kaisha, Tokyo, Japan

[21] Appl. No.: 2,276

[22] Filed: Jan. 8, 1993

[30] Foreign Application Priority Data

Jan. 13, 1992 [JP] Japan .................. 4-023239

[51] Int. Cl.$^6$ .............................................. H01S 3/08
[52] U.S. Cl. .......................................... 372/96; 372/45
[58] Field of Search .............................. 372/45, 50, 96

[56] References Cited

U.S. PATENT DOCUMENTS

| 4,665,528 | 5/1987 | Chinone et al. | 372/96 |
| 4,704,720 | 11/1987 | Yamaguchi | 372/96 |
| 4,847,857 | 7/1989 | Ohkura | 372/96 |
| 4,964,134 | 10/1990 | Westbrook et al. | 372/96 |
| 5,020,153 | 5/1991 | Choa | 372/96 |
| 5,084,897 | 1/1992 | Numai | 372/96 |
| 5,117,469 | 5/1992 | Cheung et al. | 385/131 |
| 5,170,402 | 12/1992 | Ogita et al. | 372/96 |
| 5,200,969 | 4/1993 | Paoli | 372/50 |
| 5,214,664 | 5/1993 | Paoli | 372/50 |
| 5,289,494 | 2/1994 | Tada et al. | 372/96 |

FOREIGN PATENT DOCUMENTS

| 0316194 | 5/1989 | European Pat. Off. . |
| 0444709 | 9/1991 | European Pat. Off. . |
| 62-2213 | 1/1987 | Japan . |
| 62-241387 | 10/1987 | Japan . |
| 63-133105 | 6/1988 | Japan . |

OTHER PUBLICATIONS

Patent Abstracts of Japan, Kokai No. 2-091,623, vol. 14, No. 296, Jun. 1990.
Patent Abstracts of Japan, Kokai No. 2-110,987, vol. 14, No. 328, Jul. 1990.
Magari, et al., "Optical Narrow-Band Filters Using Optical Amplication with Distributed Feedback", I.E.E.E. Journal of Quantum Electronics, vol. 24, No. 11, pp. 2178-2190, Nov. 1988.
Patent Abstracts of Japan, Kokai No. 62-002213, vol. 11, No. 170, p. 114, Jun. 1987.
Patent Abstracts of Japan, Kokai No. 62-241387, vol. 12, No. 111, p. 103, Apr. 1988.
Patent Abstracts of Japan, Kokai No. 63-133105, vol. 12, No. 390, p. 123, Oct. 1988.

Primary Examiner—Rodney B. Bovernick
Assistant Examiner—Robert E. Wise
Attorney, Agent, or Firm—Fitzpatrick, Cella, Harper & Scinto

[57] ABSTRACT

A semiconductor optical filter that includes a semiconductor substrate and a laser structure formed on the substrate. The laser structure includes an active layer of a quantum well structure and a grating formed along the active layer. The active layer is constructed to have a ground state level and an energy level other than the ground state level. A saturation gain of the ground state level is set to a value less than an internal loss, and the other energy level is set to permit an increase in the amount of carriers injected into the laser structure. The laser structure is typically a distributed feedback type laser structure. Anti-reflection coatings may be formed on the end surfaces of the laser structure.

9 Claims, 6 Drawing Sheets

SEMICONDUCTOR OPTICAL FILTER AND AN OPTICAL COMMUNICATION SYSTEM USING THE SAME

BACKGROUND OF THE INVENTION

1. Field of the Invention

The present invention relates generally to an optical filter, and more specifically to a semiconductor optical filter that includes a distributed feedback semiconductor laser structure and is capable of tuning or changing a wavelength of resonance-amplified light, which is caused by a plasma effect that is due to a change in carrier density within the laser structure. The present invention also relates to an optical communication system using such an optical filter.

2. Related Background Art

In conventional optical filtering devices or demultiplexers used for selecting and transmitting an arbitrary optical signal from among wavelength-multiplexed optical signals, there have been proposed various types of devices. Among them, many distributed feedback (DFB) type and distributed Bragg reflector (DBR) type tunable optical filters using gratings have been proposed as a demultiplexer applicable to a high-density wavelength division multiplexing system or a light frequency division multiplexing system, which is expected as a future optical transmission system because of its high wavelength resolution, its capability of tuning a wavelength to be selected, its suitability to integration, etc. Japanese patent laid-open application Nos. 62-2213, 62-241387 and 63-133105 and U.S. Pat. No. 5,084,897 disclose such tunable demultiplexers or optical filter devices.

FIG. 1 shows a schematic cross section of such a prior art tunable optical filter.

In the structure of FIG. 1, a grating 53 is formed at the right side portion of a waveguide layer 52, and an active layer 51 is formed at an upper portion of the left side of the waveguide layer 52. Electrodes for injecting current are respectively provided on an optical gain region 54, a phase adjusting region 55, and a distributed Bragg reflector (DBR) region 56. The tuning or changing of a selected wavelength is performed by injecting carriers into either or both the phase adjusting region 55 or/and the DBR region 56. The change in the refractive index caused by a plasma effect due to the change in the carrier density is utilized, and the distribution feedback wavelength is tuned by this change in the refractive index or the selected transmission wavelength.

As discussed above, in the prior art tunable optical filter, the refractive index is changed utilizing a plasma effect, due to the carrier injection, to achieve the tuning of the selected wavelength, but when the carrier injection is conducted, optical gain and spontaneous emission light intensity are also changed along with the change in the refractive index. Therefore, in order to both obtain a stable wavelength selectivity and sufficiently suppress crosstalk with a non-selected wavelength, it is necessary to restrict the amount of carrier injection. As a result, the tunable or changeable range of the selected wavelength is necessarily limited.

The change in optical gain is large in a semiconductor optical filter utilizing resonator type optical amplification, and the optical gain is greatly fluctuated by a bias current $I_b$ injected into the DBR region 56, as shown in FIG. 2. In this case, the current injected into the optical gain region 54 is adjusted to compensate for that fluctuation, but at the same time the temperature of the device fluctuates and the refractive index in the device is also changed. Thus, such an adjustment is complicated, and an external electric circuit for conducting the adjustment becomes large in size.

Further, the active layer 51, separate from the waveguide layer 52, is used in the gain region 54, and therefore, the optical coupling design and manufacturing process are sophisticated.

SUMMARY OF THE INVENTION

It is an object of the present invention to provide a semiconductor optical filter having a structure that can solve the above-discussed problems and an optical communication system that uses the optical filter.

According to one aspect of the present invention, a semiconductor optical filter comprises a semiconductor substrate and a laser structure formed on the substrate. The laser structure comprises an active layer and grating means formed along the active layer. The active layer has a quantum well structure constructed to have a ground state energy level that has a saturation gain, which is set to a value less than internal losses of the optical filter, and a second energy level that is at an energy level other than the ground energy state, and is set to permit an increase in quantity of carriers injected into the laser structure.

The laser structure may comprise a distributed feedback type laser structure, and the active layer may be of the separate confinement hetero-junction type and comprise a single quantum well. The optical filter may further comprise anti-reflection coatings formed on end surfaces of the laser structure, where the anti-reflection coatings exhibit a low reflectance in a light-emission wavelength range of a second energy level of the other energy level in the active layer. The active layer may comprise a plurality of quantum wells, each having different widths and different depths of energy band structure. The optical filter may further comprise anti-reflection coatings formed on end surfaces of the laser structure, where the anti-reflection coatings exhibit a low reflectance in a light-emission wavelength range of a ground state level of the other energy level of the quantum well having a wider energy band structure. The laser structure may further comprise a light guide layer, the optical filter may comprise a single electrode formed on the laser structure for injecting carriers into the laser structure, and the grating means may comprise a second order diffraction grating.

According to another aspect of the present invention, an optical communication system comprises an optical transmission line, and plurality of terminal units connected to each other by the optical transmission line. The terminal units comprises a receiver portion, a transmitter portion and a branching-combining device for connecting the transmitter portion and the receiver portion. The receiver portion comprises a semiconductor optical filter. The semiconductor optical filter comprises a semiconductor substrate, and a laser structure formed on the substrate. The laser structure comprises an active layer, and grating means formed along the active layer, where the active layer has a quantum well structure constructed to have a ground state energy level that has a saturation gain, which is set to a value less than internal losses of the optical filter, and a second energy level that is at an energy level other than the ground energy state, and is set to permit an increasing quantity of carriers injected into the laser structure.

A typical semiconductor band pass filter, according to the present invention, includes a distributed feedback semiconductor laser structure with a grating, where only a predetermined selected wavelength, which is determined by a pitch or periodicity of the grating, is amplified and transmitted from among the incident optical signals. A saturation gain at a ground state level of an active layer of the laser structure is adjusted to a value less than an internal loss or the sum of losses due to diffractions of the grating, reflections at filter end surfaces, absorption by the active layer itself and so forth.

The grating is formed so that the distributed feedback occurs in a wavelength range in which a single passage gain, due to the ground level of a quantum well of the active layer, is large, and the loss in such wavelength range is made large by setting the grating pitch to a value that causes the distributed feedback in this wavelength range by second or more order diffraction of the grating. Then, as carriers increase, the change of gain in the wavelength range $\lambda_a$ corresponding to the ground level (see FIG. 4) is small, while the single passage gain in the wavelength range $\lambda_b$ corresponding to the second energy level of the quantum well of the active layer increases. Namely, the carrier density can be greatly varied while the change in gain in the wavelength range $\lambda_a$, wherein the distributed feedback occurs by the grating, remains small. As a result, the distributed feedback wavelength can be largely changed by the change in refractive index due to plasma effect. Further, anti-reflection coatings, which exhibit low reflection factors in the wavelength range $\lambda_b$ corresponding to the second level of the active layer, are formed at the filter end surfaces so that the laser oscillation of Fabry-Perot mode can be oppressed in this wavelength range $\lambda_b$. Hence, it becomes possible to change the carrier density in a wider range, and the tuning wavelength range can be widened.

These advantages and others will be more readily understood in connection with the following detailed description of the preferred embodiments in conjunction with the drawings.

DESCRIPTION OF THE PREFERRED EMBODIMENT

Figure 1:
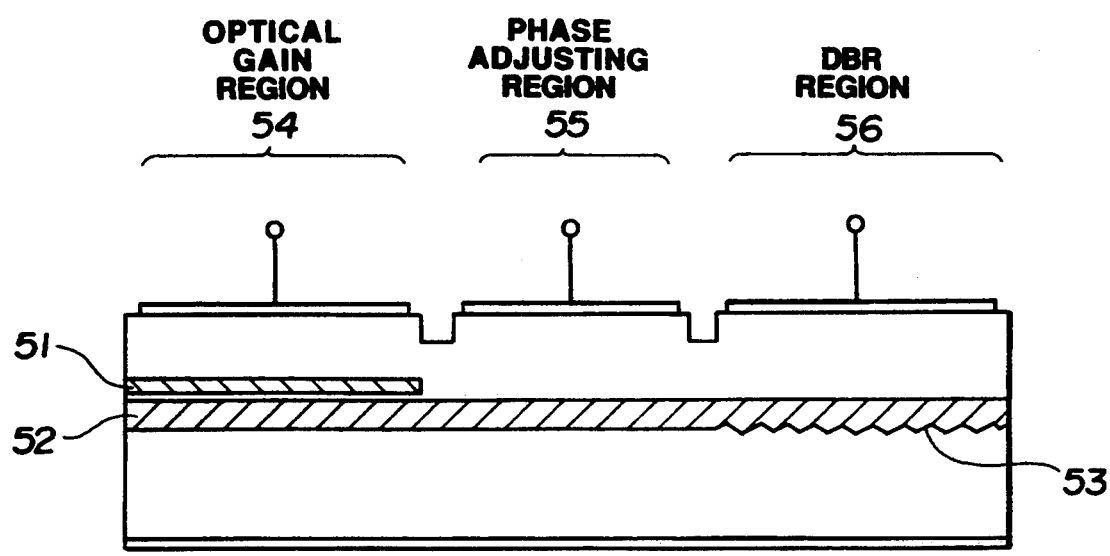
FIG. 1 is a schematic cross-sectional view showing a prior art optical filter device.
Figure 2:
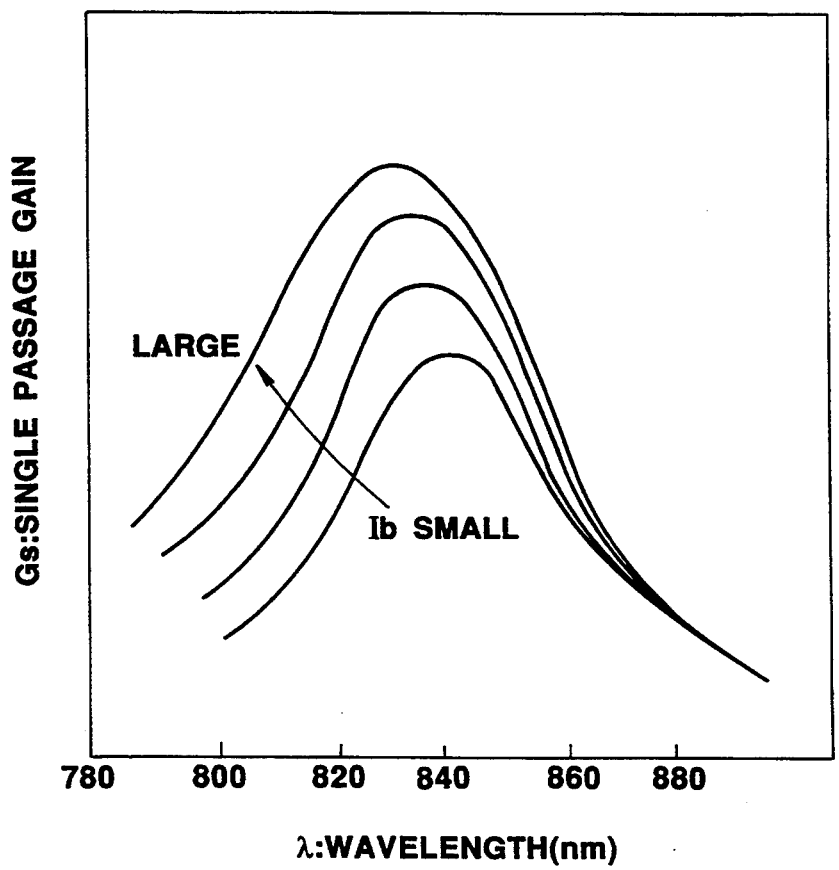
FIG. 2 is a graph illustrating a gain spectrum of a a prior art optical filter device.
Figure 3A:
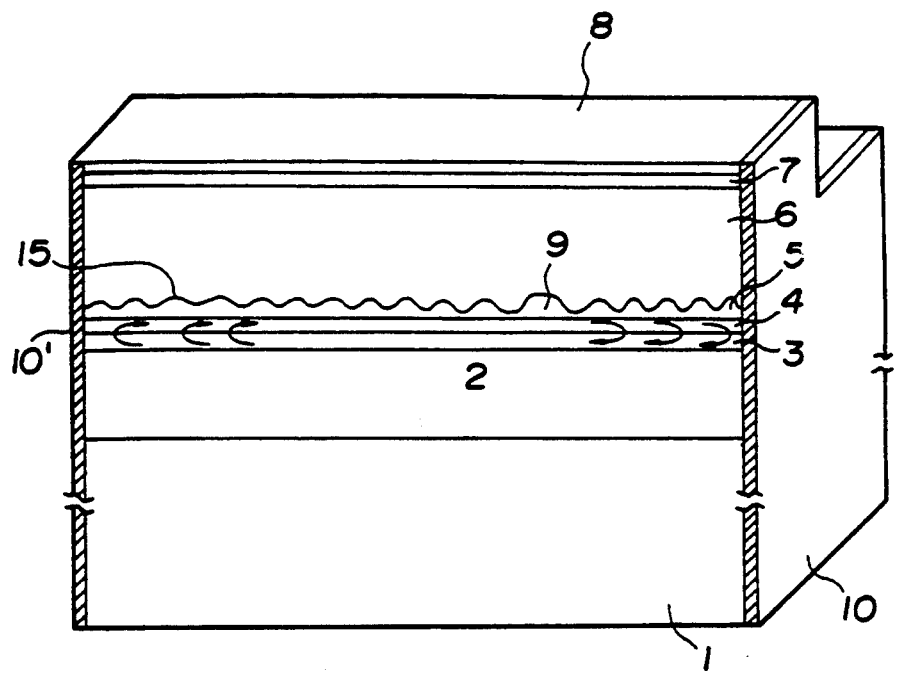
FIG. 3A is a schematic cross-sectional view showing the structure of a first embodiment of an optical filter according to the present invention.
Figure 3B:
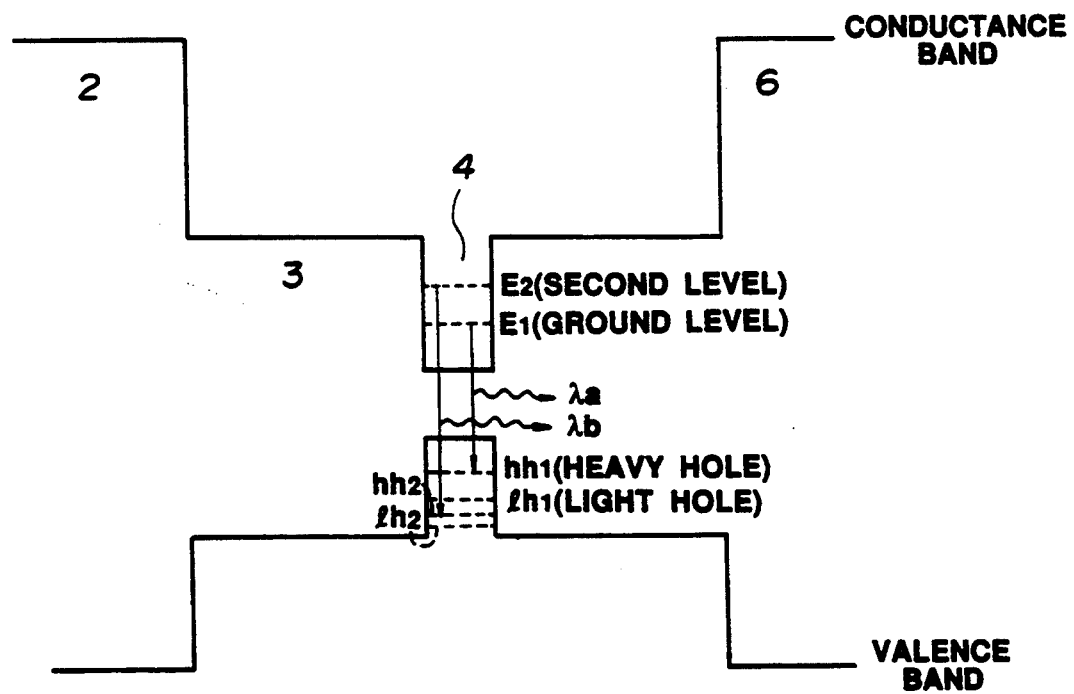
FIG. 3B is a view illustrating an energy band structure of an active layer of the first embodiment.

A preferred first embodiment of a semiconductor optical filter according to the present invention will be described with reference to FIGS. 3A and 3B. FIG. 3A shows the structure of the first embodiment using a cross-sectional perspective view of half of a device, and FIG. 3B shows the energy level of a quantum well of an active layer of the first embodiment.

In FIG. 3A, reference numeral 1 designates an n-type GaAs substrate, reference numeral 2 designates an n-type $Al_{0.5}Ga_{0.5}As$ cladding layer, reference numeral 3 designates an intrinsic (i−) $Al_{0.2}Ga_{0.8}As$ light guide layer, reference numeral 4 designates a single quantum well GaAs layer having a thickness of 60 Å, which acts as an active layer, and reference numeral 5 designates a p-type $Al_{0.2}Ga_{0.8}As$ light guide layer in which a grating 15, having a pitch of 0.245 μm, is formed. Further, reference numeral 6 designates a p-type $Al_{0.5}Ga_{0.5}As$ cladding layer, reference numeral 7 designates a p-type GaAs cap layer, reference numeral 8 designates an Au/Cr electrode and reference numeral 9 designates a phase-shifted portion formed in the grating 15. On opposite end surfaces of the device, anti-reflection coatings 10 and 10' are provided and these coatings 10 and 10' are formed so that their reflectances or reflection factors are less than 1% in a wavelength range from 817 nm to 821 nm.

Figure 4:
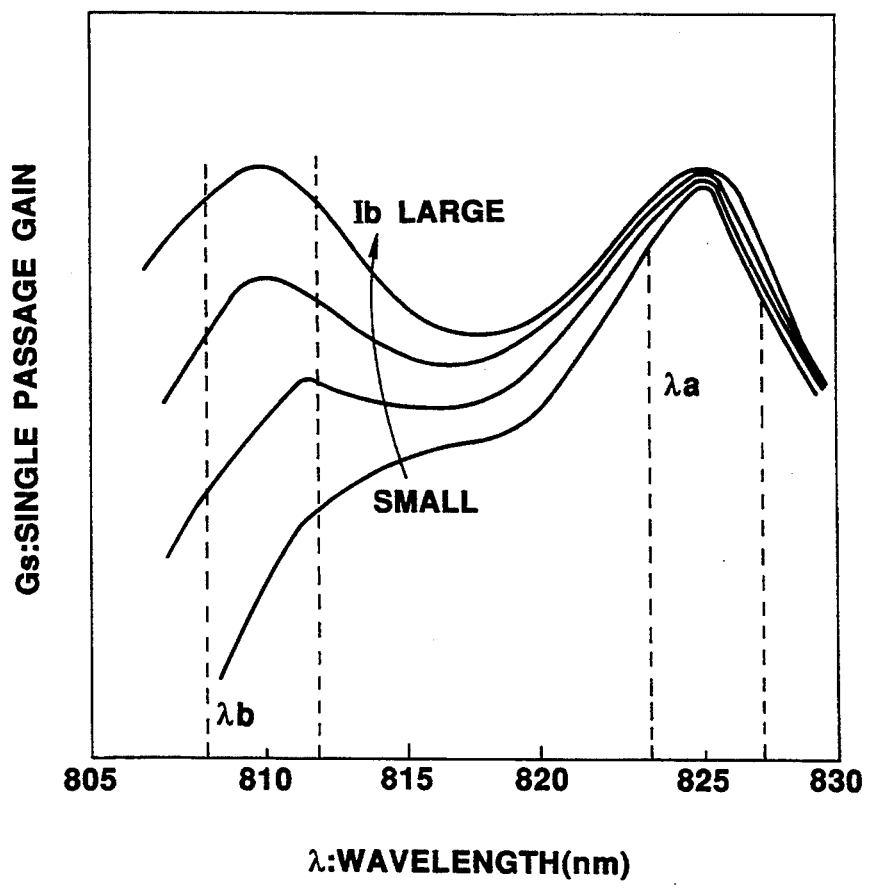
FIG. 4 is a graph illustrating a gain spectrum of the first embodiment of the present invention.

The optical confinement in a lateral direction is achieved by etching the upper cladding layer 6 into a ridge form. In the above structure, when a bias current of about 20 mA is injected through the electrode 8, a gain peak created by the recombination of electrons at a ground state level of the quantum well 4 lies in the vicinity of 830 nm (see $\lambda_a$ in FIG. 4) and a gain peak created by the recombination of electrons at a second energy level of the quantum well 4 lies near 819 nm (see $\lambda_b$ in FIG. 4) as described in the explanation of FIG. 4. The magnitudes of those gains are generally the same. Further, the second order diffraction wavelength of the grating 15 is 830 nm, and a resonator type amplifier having a narrow filtering bandwidth is thus obtained.

At this time, when the bias current is changed around the value of 20 mA, the change in the single passage gain $G_s$ of the active layer is small near the wavelength of 830 nm ($\lambda_a$), but the single passage gain varies largely near the wavelength of 819 nm ($\lambda_b$). The reason why the change in $G_s$ varies is that the electron distribution shifts toward a higher energy side, resulting from the increase of Fermi level energy when the electron density increases, and that the state density becomes large at the second energy level compared with that of the ground level. The recombination efficiency, which is proportional with the product of distribution function and state density, thus becomes large at the second level. In more detail, while the recombination efficiency of electrons at the ground level of a lower energy side is saturated and becomes unchanged, the recombination efficiency of electrons at the second energy level of a higher energy side fluctuates greatly. As a result, the electron density can be greatly changed while the single passage gain $G_s$ in the 830 nm-wavelength ($\lambda_a$) range of a lower energy side remains unchanged.

if the single passage gain near the wavelength of 819 nm ($\lambda_b$) of a higher energy side is too large, a laser oscillation of the Fabry-Perot type is caused in this wavelength range and excess or unwanted light, having a high power, would be emitted outside of the filter. To prevent this emission, the anti-reflection coatings 10 and 10' are formed at the filter end surfaces, by which the reflection factor is made less than 1% in the range of 817 nm to 821 nm of a higher energy side. Thus, an injection current that can cause the laser oscillation is raised to over 60 mA.

It thus becomes possible to change the bias current $I_b$ by a value from 30 mA to 60 mA while not changing the single passage gain near the wavelength of 830 nm of a lower energy side ($\lambda_a$) and not creating the laser oscillation in the higher energy side range ($\lambda_b$). Difference $\Delta N$ in the electron density of a value of $1.2 \times 10^{18}$ can be obtained and the difference $\Delta n$ in an effective refractive index due to plasma effect is about $2 \times 10^{-3}$ when near the wavelength of $\lambda_a = 830$ nm. The difference $\Delta n$ in effective refractive index is represented by:

$$\Delta n = \gamma_0 \lambda^2 / 2\pi n (\Delta N/m_e + \Delta P/m_h)$$

where $\gamma_0$ is an electron diameter, $m_e$ and $m_h$ are respectively effective masses of electron and hole, n is a refractive index of the active layer and N(=P) is a carrier density. The change $\Delta n_{eff}$ in effective refractive index of the entire active layer 4 is about $1 \times 10^{-3}$.

The resonance wavelength $\lambda_p$ due to the grating 15 is $\lambda_p = \Lambda n_{eff}$ ($\Lambda$: a pitch of the grating 15), and hence the change $\Delta \lambda_p$ in the resonance wavelength due to $\Delta n_{eff}$ is 5 Å. Actually, the change in refractive index due to band filling effect also occurs since the carrier density is raised, and hence it is possible to control or change the resonance wavelength over a range of about 10 Å.

Thus, in the first embodiment, a tunable filter having a single-electrode DFB laser structure can be attained in which the selected wavelength can be varied in a relatively wide range of about 10 Å.

In the first embodiment, a single quantum well 4 is formed as an active layer, and the gain due to the recombination of electrons at the ground level is saturated, while the gain due to the recombination of electrons at the second level varies in response to an increase or decrease of the injected current $I_b$. The second level is set to permit an increase in the amount of carriers injected. In a second embodiment, a plurality of quantum wells having different energy gaps are formed adjacent to each other, and the gain due to the recombination of electrons at the lowest energy level of the ground levels of the respective quantum wells is saturated.

Figure 5A:
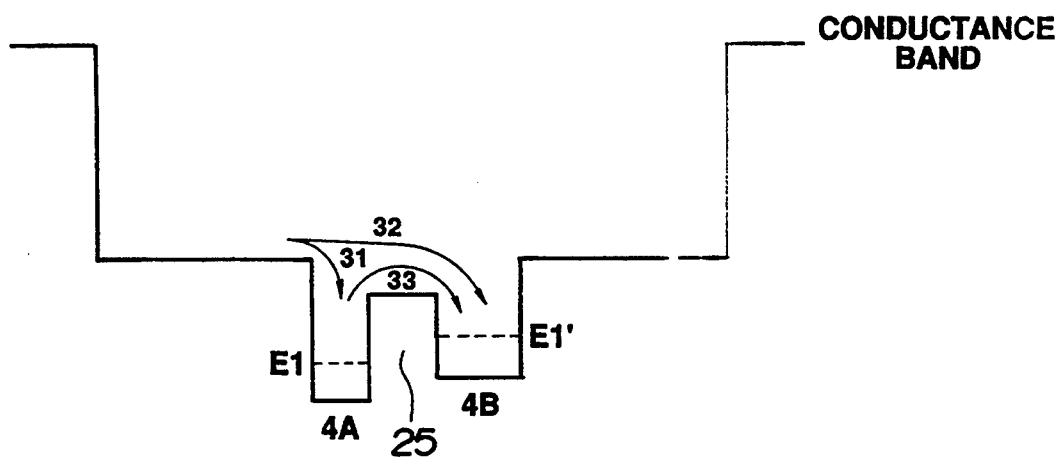
FIG. 5A is a view illustrating an energy band structure of an active layer of a second embodiment of an optical filter according to the present invention.

FIG. 5A shows an energy band structure of an active layer of the second embodiment. The basic structure of the device is the same as the first embodiment, and two quantum wells 4A and 4B are provided as shown in FIG. 5A in place of the active layer 4 in the first embodiment of FIG. 3B. The two wells are respectively a GaAs layer 4A having a thickness of 60 Å and an $Al_{0.08}Ga_{0.92}As$ layer 4B having a thickness of 100 Å, and an $Al_{0.15}Ga_{0.85}As$ layer 25 having a thickness of 150 Å is formed as a barrier layer therebetween.

In the structure, when a current is injected, electrons are initially injected chiefly into the narrower quantum well 4A, as indicated by a numeral 31 in FIG. 5A. The gain having a peak near the wavelength of 830 nm ($\lambda_A$ in FIG. 5B) is caused by the recombination of electrons at a ground level $E_1$ of the narrower well 4A. Then, as the current $I_b$ further increases, electrons also flow into the wider quantum well 4B, as indicated by a numeral 32 in FIG. 5A, and electrons flowing from the quantum well 4A into the quantum well 4B also increase, as indicated by a numeral 33 in FIG. 5A. As a result, the gain having a peak near the wavelength of 800 nm ($\lambda_B$ in FIG. 5B) appears due to the recombination of electrons at a ground level $E_1'$ of the wider quantum well 4B.

Figure 5B:
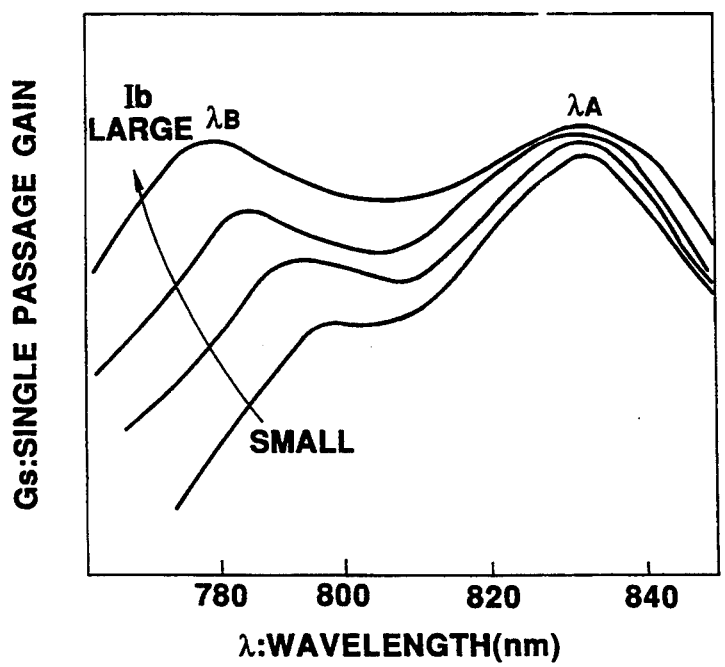
FIG. 5B is a graph illustrating a gain spectrum of the second embodiment.

Here, the second order grating pitch formed in the device is the same as the first embodiment, and the distributed feedback occurs at the wavelength of 830 nm ($\lambda_A$). Further, anti-reflection coatings formed at the end surfaces of the device are formed so that the reflection factor is less than 1% in the range from 798 nm to 802 nm (around $\lambda_B$). Thus, similar to the first embodiment, it is possible to change the carrier density in the active layer without changing the gain around the wavelength of 830 nm (lower energy side wavelength) as shown in FIG. 5B.

In the first embodiment, since the central wavelength of a gain peak at a higher energy side is determined by the single quantum well 4, it is impossible to separate the central wavelength of the gain peak at the higher energy side far from that at a lower energy side. In contrast, in the second embodiment, the central wavelength $\lambda_B$ of the gain peak at a higher energy side can be largely separated from the central wavelength $\lambda_A$ of a gain peak at a lower energy side because of the separately formed quantum wells 4A and 4B. Further, only the gain in the wavelength range $\lambda_B$, remote from a signal light in the wavelength range $\lambda_A$ to be filtered, fluctuates. Therefore, the signal light in the wavelength range $\lambda_A$ can easily be selected when signal receiving is conducted. Further, beat noise can be greatly reduced.

Although the optical filter is explained in the first and second embodiments, other semiconductor or dielectric materials may be used in place of the above described material. Further, other types of optical waveguide structures may be adopted. For example, a surface type structure in which a light is input vertically to a multi-layer structure may be used. In this structure, layers having different refractive indexes are alternately formed in the distributed feedback or Bragg reflector structure in place of the above-discussed diffraction grating type waveguide. In this case, anti-reflection coatings are provided on both opposite facets of the optical device.

Figure 6:
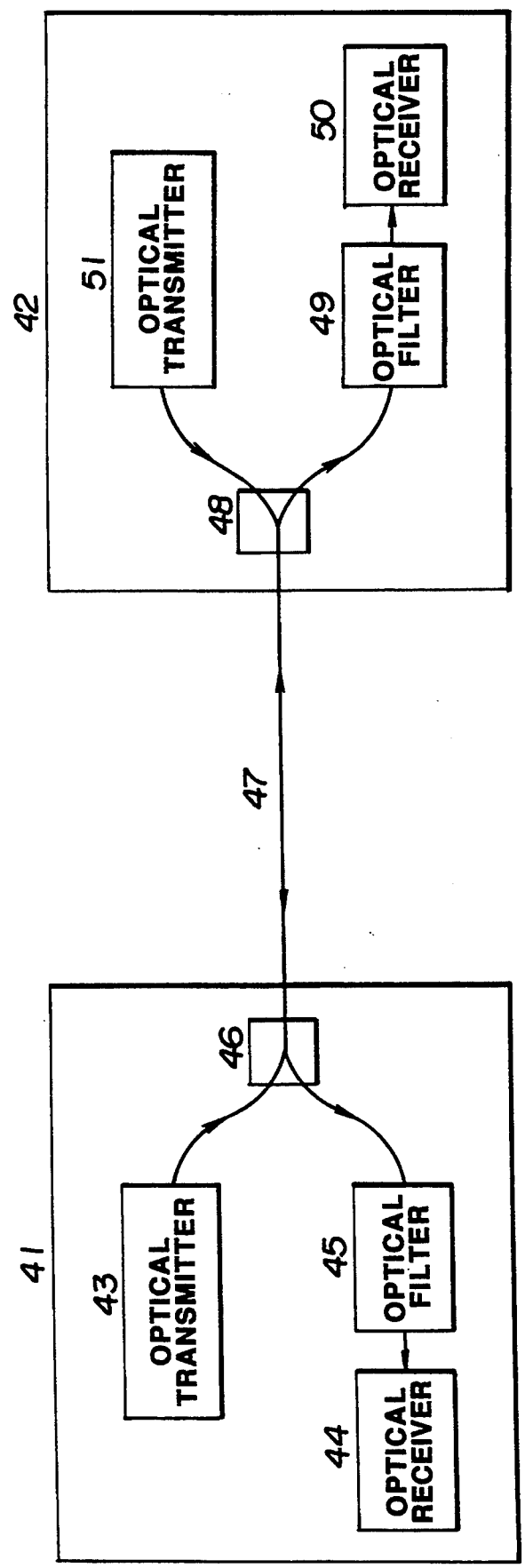
FIG. 6 is a block diagram of an embodiment of an optical communication system using an optical filter of the present invention.

FIG. 6 shows an optical communication system or wavelength division multiplexing (WDM) communication system in which the above-described first or second embodiment of an integrated optical filter is used. In the system of FIG. 6, reference numerals 41 and 42 designate terminal units respectively, and reference numeral 47 designates an optical transmission line. The terminal units 41 and 42 contain receiver portions and transmitter portions respectively. The transmitter portions comprise optical transmitters 43 and 51 respectively, each of which includes a signal processing unit and an electro-optical converter unit. The receiver portions comprise optical filters 45 and 49 respectively, for selecting only a predetermined wavelength from input optical signals, and optical receivers 44 and 50, each of which includes an opto-electrical converter unit and a signal processing unit. In the terminal units 41 and 42, the transmitter units and the receiver units are respectively connected to each other by branching-combining devices 46 and 48, and the terminal units 41 and 42 are connected to each other through the optical transmission line 47.

In the structure of FIG. 6, optical signals supplied from the optical transmitter 43, in the terminal unit 41, and the optical transmitter 51, in the terminal unit 42, are respectively transmitted to the transmission line 47 through the branching-combining devices 46 and 48. The transmitted optical signals are then input into the receiving terminal units 42 and 41, and supplied to the optical filters 49 and 45 through the branching-combining devices 48 and 46. In the optical filters 49 and 45, only signals of predetermined wavelengths are respectively selected, and the selected signals are input into the respective optical receivers 50 and 44.

FIG. 6 shows an example of a one-to-one bi-directional communication system. However, a structure in which a terminal unit includes a plurality of transmitter portions and a plurality of receiver portions, and a structure in which a plurality of terminal units are connected by a branching-combining device and the like are also applicable. It is also possible to construct a structure in which the same terminal unit as shown in FIG. 6 is used and the terminal units are either connected in a bus form by an optical transmission line, connected in a loop form by an optical transmission line, or connected in a star form by an optical transmission line and a star coupler.

When a semiconductor optical filter of the present invention is used as an optical filter in the above-discussed system, only an optical signal of a predetermined wavelength is amplified and its output can be increased, compared with the other optical signals. Thus, noise can be reduced at the optical receiver portion, and a more desirable optical communication system can be built. Further, since a wavelength tuning range can be widened, the number of wavelength division multiplexity can be increased and hence an optical communication system having a greater number of terminals can be constructed.

According to the present invention, the following technical advantages can be obtained. First, since the carrier density can be greatly changed in the laser structure, the tuning range of selected wavelength in the filter can be widened. Secondly, since the threshold current at which the filter laser-oscillates is high, the tuning control of the filter can stably be performed. Finally, since the wavelength tuning can be performed by a single electrode, the control of the filter is easy and the device manufacturing process is simple.

Except as otherwise disclosed herein, the various components shown in outline or in block form in the figures are individually well-known in their internal construction and operation and are not critical either to the making or using of this invention or to a description of the best mode of the invention.

While the present invention has been described with respect to what is presently considered to be the preferred embodiments, it is to be understood that the invention is not limited to the disclosed embodiments. The present invention is intended to cover various modifications and equivalent arrangements included within the sprit and scope of the appended claims.

What is claimed is:

1. A semiconductor optical filter comprising:
a semiconductor substrate;
a laser structure formed on said substrate, said laser structure comprising:
an active layer; and
grating means formed along said active layer;
wherein said active layer has a quantum well structure constructed to have
a ground state energy level that has a saturation gain, which is set to a value less than internal losses of said optical filter, and
a second energy level, which is at an energy level other than the ground energy state, and is set to permit an increase in quantity of carriers injected into said laser structure.

2. A semiconductor optical filter according to claim 1, wherein said active layer is of a separate confinement hereto-junction type and comprises a single quantum well.

3. A semiconductor optical filter according to claim 1, further comprising anti-reflection coatings formed on end surfaces of said laser structure, said anti-reflection coatings exhibiting a low reflectance in a light-emission wavelength range of a second energy level in said active layer.

4. A semiconductor optical filter according to claim 1, wherein said laser structure further comprises a light guide layer.

5. A semiconductor optical filter according to claim 1, further comprising a single electrode formed on said laser structure for injecting carriers into said laser structure.

6. A semiconductor optical filter according to claim 1, wherein said grating means comprises a second order grating.

7. A semiconductor optical filter according to claim 1, wherein said active layer comprises a plurality of quantum wells having different widths and different depths of energy band structure.

8. A semiconductor optical filter according to claim 7, further comprising anti-reflection coatings formed on end surfaces of said laser structure, said anti-reflection coatings exhibiting a low reflectance in a light-emission wavelength range of said second energy level, which is a ground state level of said quantum well having a wider energy band structure.

9. An optical communication system comprising:
an optical transmission line;
a plurality of terminal units connected to each other by said optical transmission line, said terminal units comprising a receiver portion, a transmitter portion and a branching-combining device for connecting said transmitter portion and said receiver portion, wherein said receiver portion comprises a semiconductor optical filter comprising:
an active layer; and
grating means formed along said active layer;
wherein said active layer has a quantum well structure constructed to have
a ground state energy level that has a saturation gain, which is set to a value less than internal losses of said optical filter, and
a second energy level, which is at an energy level other than the ground energy state, and is set to permit an increase in quantity of carriers injected into said laser structure.

* * * * *

UNITED STATES PATENT AND TRADEMARK OFFICE
CERTIFICATE OF CORRECTION

PATENT NO. : 5,440,581

DATED : August 8, 1995

INVENTOR(S) : TAKEO ONO, ET AL.

It is certified that error appears in the above-identified patent and that said Letters Patent is hereby corrected as shown below:

ON TITLE PAGE

In [56] References Cited, under OTHER PUBLICATIONS: "Amplication" should read --Amplification--.

COLUMN 3

Line 51, "a a" should read --a--.

COLUMN 4

Line 65, "if" should read --If--.

COLUMN 8

Line 14, "hereto-junction" should read --hetero-junction--.

Signed and Sealed this

Twelfth Day of December, 1995

Attest:

BRUCE LEHMAN

*Attesting Officer*     *Commissioner of Patents and Trademarks*